United States Patent
Adachi et al.

(10) Patent No.: US 10,927,442 B2
(45) Date of Patent: Feb. 23, 2021

(54) NANOCRYSTAL PRODUCTION METHOD, AND STEEL PRODUCTION METHOD

(71) Applicants: HITACHI CHEMICAL COMPANY, LTD., Tokyo (JP); NATIONAL UNIVERSITY CORPORATION HOKKAIDO UNIVERSITY, Hokkaido (JP)

(72) Inventors: Shuichiro Adachi, Tokyo (JP); Masaki Kitagawa, Tokyo (JP); Seiichi Watanabe, Sapporo (JP); Lihua Zhang, Sapporo (JP); Noriyuki Okinaka, Sapporo (JP); Dai Takai, Sapporo (JP)

(73) Assignees: Showa Denko Materials Co., Ltd., Tokyo (JP); NATIONAL UNIVERSITY CORPORATION HOKKAIDO UNIVERSITY, Hokkaido (JP)

( * ) Notice: Subject to any disclaimer, the term of this patent is extended or adjusted under 35 U.S.C. 154(b) by 181 days.

(21) Appl. No.: 16/329,439

(22) PCT Filed: Aug. 25, 2017

(86) PCT No.: PCT/JP2017/030585
§ 371 (c)(1),
(2) Date: Feb. 28, 2019

(87) PCT Pub. No.: WO2018/043351
PCT Pub. Date: Mar. 8, 2018

(65) Prior Publication Data
US 2019/0249288 A1    Aug. 15, 2019

(30) Foreign Application Priority Data

Sep. 1, 2016    (JP) .................... 2016-171252

(51) Int. Cl.
*C23C 8/14* (2006.01)
*C01B 3/08* (2006.01)
(Continued)

(52) U.S. Cl.
CPC ............... *C23C 8/14* (2013.01); *B82Y 30/00* (2013.01); *B82Y 40/00* (2013.01); *C01B 3/08* (2013.01);
(Continued)

(58) Field of Classification Search
CPC ..................................................... C23C 8/14
(Continued)

(56) References Cited

FOREIGN PATENT DOCUMENTS

| JP | S43-012435 B | 5/1968 |
| JP | S54-151598 A | 11/1979 |

(Continued)

OTHER PUBLICATIONS

Sutherland, Thomas "Model of the Formation of Iron Oxide Nanoparticles by Irradiation in Aqueous Media" (2016). (Year: 2016).*

*Primary Examiner* — Coris Fung
*Assistant Examiner* — Danielle M. Carda
(74) *Attorney, Agent, or Firm* — Fitch, Even, Tabin & Flannery, LLP

(57) ABSTRACT

A nanocrystal production method includes a light irradiation step of applying light to a surface of a metal material immersed in water to form nanocrystals on the surface. In this nanocrystal production method, the metal material contains iron, the nanocrystal contains at least one of iron oxide and iron hydroxide, and in the spectrum of the light, a wavelength at which the intensity is maximum is not less than 360 nm and less than 620 nm.

14 Claims, 5 Drawing Sheets

(51) Int. Cl.
    *C01G 49/02*     (2006.01)
    *B82Y 40/00*     (2011.01)
    *B82Y 30/00*     (2011.01)
    *C23C 8/02*     (2006.01)
    *C22C 38/00*     (2006.01)
    *C22C 37/00*     (2006.01)
    *C22C 38/60*     (2006.01)

(52) U.S. Cl.
    CPC ................ *C01G 49/02* (2013.01); *C23C 8/02* (2013.01); *C01P 2004/03* (2013.01); *C01P 2004/30* (2013.01); *C22C 37/00* (2013.01); *C22C 38/00* (2013.01); *C22C 38/60* (2013.01)

(58) Field of Classification Search
    USPC ........................................................ 148/241
    See application file for complete search history.

(56) References Cited

FOREIGN PATENT DOCUMENTS

| | | |
|---|---|---|
| JP | S62-041722 A | 2/1987 |
| JP | S62-223027 A | 10/1987 |
| JP | S63-181305 A | 7/1988 |
| JP | 2009-057568 A | 3/2009 |
| WO | 2018/135145 A1 | 7/2018 |

\* cited by examiner

NANOCRYSTAL PRODUCTION METHOD, AND STEEL PRODUCTION METHOD

CROSS-REFERENCE TO RELATED APPLICATIONS

This application is a U.S. national phase application filed under 35 U.S.C. § 371 of International Application No. PCT/JP2017/030585, filed Aug. 25, 2017, designating the United States, which claims priority from Japanese Patent Application No. 2016-171252, filed Sep. 1, 2016, which are hereby incorporated herein by reference in their entireties.

TECHNICAL FIELD

The present invention relates to a nanocrystal production method and a steel production method.

BACKGROUND ART

In recent years, nanomaterials having characteristics different from those of bulk materials have attracted attention. Nanomaterials are being applied in the field of engineering devices. Examples of nanomaterials include nanocrystals made of iron oxide or iron hydroxide.

Examples of representative iron oxides include FeO (wustite), $Fe_3O_4$ (magnetite), $\alpha$-$Fe_2O_3$ (hematite), and $\gamma$-$Fe_2O_3$ (maghemite or gamma hematite). Examples of representative iron hydroxides include $\alpha$-FeOOH (goethite), $\beta$-FeOOH (akaganite), $Fe(OH)_2$, and $Fe(OH)_3$. Iron oxides and iron hydroxides have been applied to dyes, pigments, catalysts, magnetic materials, positive electrode materials of secondary batteries, abrasives, and the like for a long time.

In particular, $\alpha$-$Fe_2O_3$ is abundant in terms of resources, non-toxic to the human body, and excellent in environmental affinity. In addition, $\alpha$-$Fe_2O_3$ also has semiconductor performance, and its band gap is around 2 eV. Thus, application as a semiconductor device (for example, an electrode material) operating with visible light is expected.

Each raw material of the iron oxide and the iron hydroxide is industrially a non-stoichiometric mixture (non-stoichiometric compound) of iron oxide and iron hydroxide obtained by oxidation of metallic iron. Iron oxide and iron hydroxide having a desired composition can be obtained by repeating heating and the like for this mixture. As methods for obtaining iron oxide and iron hydroxide having a specific composition, the following Patent Literatures 1 to 6 disclose a hydrothermal synthesis method, a coprecipitation method, a laser irradiation method, or a chemical vapor deposition method (CVD method).

CITATION LIST

Patent Literatures

Patent Literature 1: Japanese Examined Patent Publication No. S43-12435
Patent Literature 2: Japanese Unexamined Patent Publication No. S54-151598
Patent Literature 3: Japanese Unexamined Patent Publication No. S62-41722
Patent Literature 4: Japanese Unexamined Patent Publication No. S62-223027
Patent Literature 5: Japanese Unexamined Patent Publication No. 2009-57568
Patent Literature 6: Japanese Unexamined Patent Publication No. S63-181305

SUMMARY OF INVENTION

Technical Problem

However, in a process involving the heating of metallic iron described above, the metallic iron may be heated up to a high temperature (for example, 1500° C.) near the melting point of iron. In addition, when desired iron oxide is obtained by releasing oxygen from iron oxide or iron hydroxide, it is necessary to heat iron oxide or iron hydroxide in vacuum. Thus, in the process involving the heating of metallic iron, there are problems in environmental burden and manufacturing cost.

In the hydrothermal synthesis methods described in Patent Literatures 1 to 4, a compound having a desired composition can be formed while controlling the size to a nanometer order size. However, the process is multi-staged and highly complicated, requiring a process at high temperature and high pressure (for example, 150° C., 10 atm). When a highly alkaline aqueous solution is used, precise control of pH is necessary, and in addition, there are problems in terms of environmental burden and manufacturing cost.

The laser irradiation method described in Patent Literature 5 and the CVD method described in Patent Literature 6 are unsuitable for industrial mass production of nanocrystals from the viewpoint of the size of the manufacturing apparatus and the manufacturing cost.

The present invention has been made in view of the above circumstances, and it is an object of the present invention to provide a nanocrystal production method capable of conveniently forming nanocrystals containing at least one of iron oxide and iron hydroxide, and a steel production method using the nanocrystal production method.

Solution to Problem

A nanocrystal production method according to one aspect of the present invention includes a light irradiation step of applying light to a surface of a metal material immersed in water to form nanocrystals on the surface. In this nanocrystal production method, the metal material contains iron, the nanocrystal contains at least one of iron oxide and iron hydroxide, and in the spectrum of the light, a wavelength at which the intensity is maximum is not less than 360 nm and less than 620 nm.

The nanocrystal production method according to one aspect of the present invention may further include a surface roughening step of roughening the surface before the light irradiation step.

In the nanocrystal production method according to one aspect of the present invention, the surface roughening step may be performed by machining, chemical treatment or discharge treatment in a liquid.

In the nanocrystal production method according to one aspect of the present invention, the metal material may contain pure iron or an iron alloy.

In the nanocrystal production method according to one aspect of the present invention, the content of iron in the metal material may be 10.0 to 100% by mass based on the total mass of the metal material.

In the nanocrystal production method according to one aspect of the present invention, the light may be sunlight or simulated sunlight.

In the nanocrystal production method according to one aspect of the present invention, water may be at least one selected from the group consisting of pure water, ion exchange water, rain water, tap water, river water, well water, filtered water, distilled water, reverse osmosis water, mineral water, spring water, dam water, and sea water.

In the nanocrystal production method according to one aspect of the present invention, the pH of water may be 5.00 to 10.0.

In the nanocrystal production method according to one aspect of the present invention, electrical conductivity of water may be 0.05 to 1.0 µS/cm.

In the nanocrystal production method according to one aspect of the present invention, the shape of nanocrystal may be at least one selected from the group consisting of a needle shape, a columnar shape, a rod shape, a tubular shape, a scaly shape, a lump shape, a flower shape, a starfish shape, a branch shape, and a convex shape.

In the nanocrystal production method according to one aspect of the present invention, a gas containing hydrogen may be produced in the light irradiation step.

In the nanocrystal production method according to one aspect of the present invention, the number of moles of oxygen in a gas may be not less than 0 times and less than 1/2 times the number of moles of hydrogen.

In the nanocrystal production method according to one aspect of the present invention, the metal material may include iron scrap.

A steel production method according to one aspect of the present invention includes a step of forming nanocrystals on the surface of a metal material by the nanocrystal production method according to the present embodiment, a step of removing the nanocrystals from the surface to recover the nanocrystals, and a step of producing steel using the metal material from which the nanocrystals have been removed.

Advantageous Effects of Invention

The present invention can provide a nanocrystal production method capable of conveniently forming nanocrystals containing at least one of iron oxide and iron hydroxide, and a steel production method using the nanocrystal production method.

DESCRIPTION OF EMBODIMENTS

Figure 1:
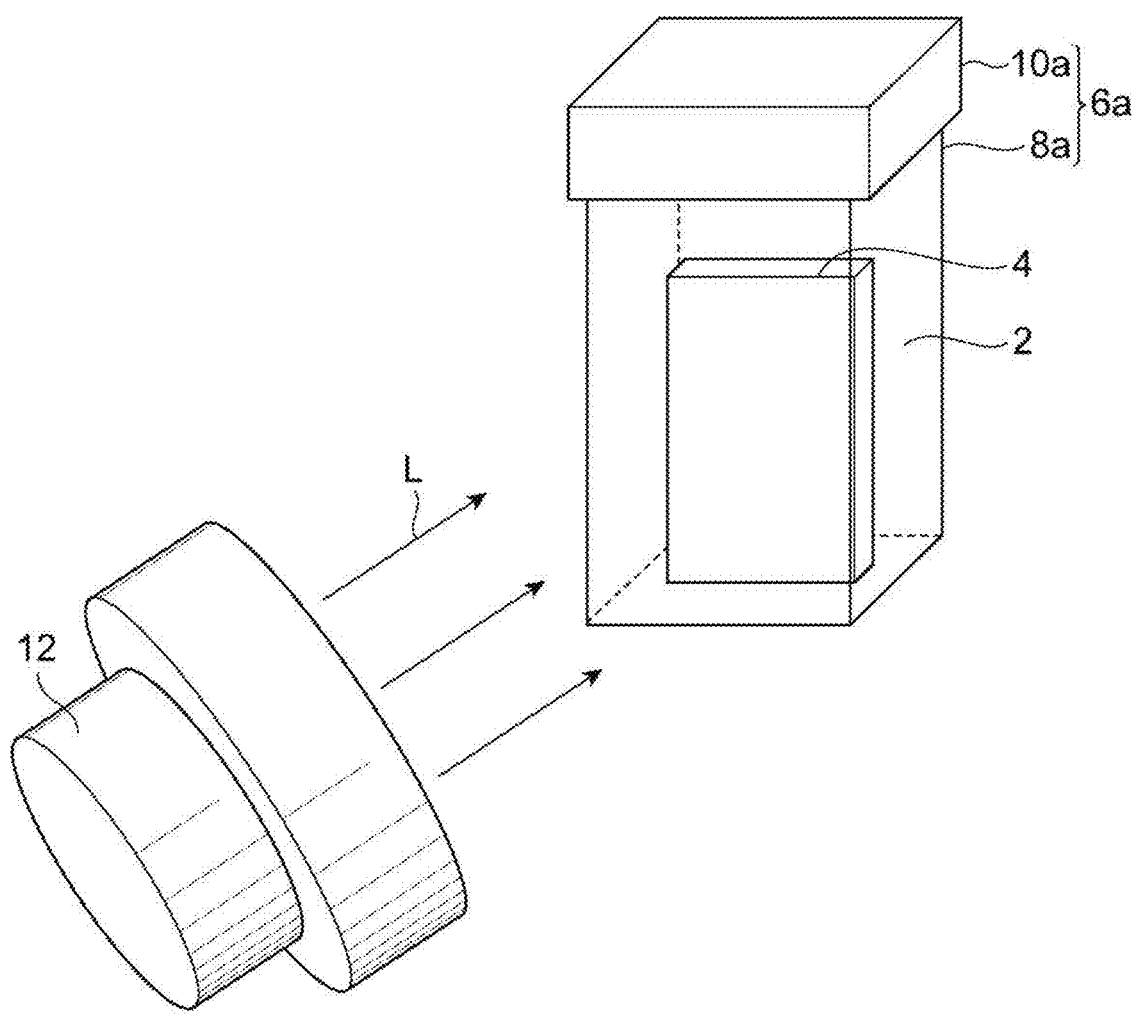
FIG. 1 is a schematic diagram showing a nanocrystal production method according to an embodiment of the present invention.

Hereinafter, a preferred embodiment of the present invention will be described in detail. However, the present invention is not limited to the following embodiment. The term "step" in the present specification includes not only an independent step but also a case where a step is not clearly distinguished from other steps as long as the purpose of the step is achieved. In the present specification, the numerical range represented by using the term "to" shows the range that includes the numerical values described before and after the term "to" as the minimum value and the maximum value, respectively. In the present specification, a content of each component in the composition means, when a plural number of the corresponding substances are present in the composition, a total amount of a plural number of the corresponding substances, otherwise specifically mentioned. In each drawing, equivalent constitutional elements are denoted with the same reference numerals.

A nanocrystal production method according to the present embodiment includes a light irradiation step. As shown in FIG. 1, in the light irradiation step, light L is applied to a surface of a metal material 4 immersed in water 2 to form nanocrystals on the surface of the metal material 4. The metal material 4 contains iron. The nanocrystal contains at least one of iron oxide and iron hydroxide. In a spectrum of the light L, the wavelength at which the intensity is maximum is not less than 360 nm and less than 620 nm. In the nanocrystal production method according to the present embodiment, a gas containing hydrogen may be produced in the light irradiation step. A place where the gas containing hydrogen is produced has not necessarily been known by research. For example, in the light irradiation step, a gas containing hydrogen is produced from the vicinity of the surface of the metal material by applying the light L to the surface of the metal material 4 immersed in the water 2. "The vicinity of the surface" implies at least one of the surface of the metal material, iron oxide, and iron hydroxide. For example, in the process in which iron hydroxide changes to iron oxide, at least one of water molecules and hydrogen gas may be produced from iron hydroxide.

A method of applying light on a surface of a metal material immersed in water to form nanocrystals on the surface of the metal material is referred to as a SPSC (submerged photosynthesis of crystallites) method. That is, in the nanocrystal production method according to the present embodiment, nanocrystals can be formed on the surface of the metal material by the SPSC method using a metal material containing iron, water, and the light.

The nanocrystal production method according to the present embodiment can conveniently form nanocrystals containing at least one of iron oxide and iron hydroxide, as compared with the conventional nanocrystal production method. In other words, the nanocrystal production method according to the present embodiment can form nanocrystals at room temperature and atmospheric pressure without requiring a heating step, a vacuum process, and the like. In the nanocrystal production method according to the present embodiment, if the formed nanocrystals are recovered from the surface of the metal material, the surface of the metal material is exposed again. The exposed surface of the metal material can then be recycled for the formation of nanocrystals. Further, in the nanocrystal production method according to the present embodiment, nanocrystals can be formed without using a high temperature process such as a hydrothermal synthesis reaction and strong alkaline water. From the above, in the nanocrystal production method according to the present embodiment, the manufacturing cost of nanocrystals is reduced, and the environmental burden associated with the production of nanocrystals can be reduced.

If the metal material containing iron is not irradiated with light after immersed in water, the reaction of iron corrosion progresses. Here, iron corrosion means that iron rusts. Generally, the reaction where iron corrodes is as follows. In the metal material containing iron, iron is ionized in water to generate $Fe^{2+}$ as shown in the following reaction formula (1). When oxygen is dissolved in water, an electron ($e^-$) reacts with a water molecule ($H_2O$) and oxygen to generate a hydroxide ion ($OH^-$) as shown in the following reaction formula (2). $Fe^{2+}$ further releases electrons to produce $Fe^{3+}$ as shown in the following reaction formula (3). $Fe^{3+}$ reacts with the hydroxide ion to produce iron hydroxide ($Fe(OH)_3$) as shown in the following reaction formula (4). Water molecules are eliminated from iron hydroxide to produce iron oxyhydroxide (FeOOH) as shown in the following reaction formula (5). Moreover, water molecules are eliminated from iron oxyhydroxide to produce iron oxide ($Fe_2O_3$), that is, rust, as shown in the following reaction formula (6). However, iron oxyhydroxide and iron oxide produced by the general iron corrosion reaction as described above have deteriorated crystallinity. That is, iron oxyhydroxide and iron oxide produced by the general iron corrosion reaction are not formed as nanocrystals as obtained by the SPSC method according to the present embodiment.

$$2Fe \rightarrow 2Fe^{2+} + 4e^- \qquad (1)$$

$$2H_2O + O_2 + 4e^- \rightarrow 4OH^- \qquad (2)$$

$$2Fe^{2+} \rightarrow 2Fe^{3+} + 2e^- \qquad (3)$$

$$Fe^{3+} + 3OH^- \rightarrow Fe(OH)_3 \qquad (4)$$

$$Fe(OH)_3 \rightarrow FeOOH + H_2O \qquad (5)$$

$$2FeOOH \rightarrow Fe_2O_3 + H_2O \qquad (6)$$

It is considered that hydroxide ions are also generated other than the reaction shown in the above reaction formula (2). For example, it is conceivable that hydroxide ions are present due to dissociation of water molecules, or hydroxide ions are present by using alkaline water. However, the reaction in which iron hydroxide ($Fe(OH)_3$), iron oxyhydroxide (FeOOH), and iron oxide ($Fe_2O_3$) are generated by these hydroxide ions is the reaction in which iron rusts. Thus, in this case, nanocrystals as obtained by the SPSC method according to the present embodiment are not formed.

As opposed to the general iron corrosion reaction, nanocrystals are formed on a surface of a metal material by applying light to the surface of the metal material in the nanocrystal production method according to the present embodiment. The present inventors presume that the mechanism by which nanocrystals are formed by the nanocrystal production method according to the present embodiment is as follows. In the nanocrystal production method according to the present embodiment, the reactions of the above reaction formulae (1) to (4) occur first. Thereafter, in the nanocrystal production method according to the present embodiment, by providing the light irradiation step, nanocrystals containing at least one of iron oxyhydroxide (FeOOH) and iron oxide ($Fe_2O_3$) grow on the surface of the metal material from iron hydroxide ($Fe(OH)_3$), and not only water molecules but also hydrogen gas ($H_2$) is produced as by-products. For example, nanocrystals of iron oxyhydroxide are formed on the surface of the metal material from iron hydroxide, and at least a portion of the nanocrystals of iron oxyhydroxide changes to nanocrystals of iron oxide. Along with the generation and growth of these nanocrystals, water molecules and hydrogen gas are also produced. For example, in the process in which iron oxyhydroxide changes to iron oxide, at least one of water molecules and hydrogen gas may be produced from iron oxyhydroxide. Here, the nanocrystals may be formed, for example, by photoinduced tip growth. The photoinduced tip growth means that tip growth of crystals is promoted in columnar or needle form by light irradiation. The mechanism by which the nanocrystals are produced is not limited to the above reaction mechanism.

In the above reaction mechanism in which nanocrystals are produced, unlike photolysis of water by the photocatalytic reaction described later, oxygen gas ($O_2$) is hardly produced. In the case of photolysis of water, a ratio of the number of moles of hydrogen gas produced to the number of moles of oxygen gas produced is 2:1. That is, based on stoichiometry, the number of moles of oxygen gas produced is 1/2 times the number of moles of hydrogen gas produced. On the other hand, in the nanocrystal production method according to the present embodiment, the number of moles of oxygen in the gas produced in the light irradiation step may be not less than 0 times and less than 1/2 times, not less than 0 times and not more than 1/5 times, or not less than 0 times and not more than 1/10 times the number of moles of hydrogen. The concentration of hydrogen in the produced gas may be greater than 66.7% by volume, 80.0 to 100% by volume, or 90.0 to 100% by volume, based on the total volume of the gas. The concentration of hydrogen in the produced gas may be greater than 66.7% by mole, 80.0 to 100% by mole, or 90.0 to 100% by mole, based on the total number of moles of all components contained in the gas. In the nanocrystal production method according to the present embodiment, hydrogen gas with high purity can be obtained.

In the nanocrystal production method according to the present embodiment, in the spectrum of light used in the light irradiation step, the wavelength at which the intensity is maximum is not less than 360 nm and less than 620 nm. The light spectrum may be referred to as spectral radiation distribution of light, and the intensity may be referred to as spectral irradiance. That is, in the present embodiment, in the spectral radiation distribution (spectrum) of light used in the light irradiation step, the wavelength of light with maximum spectral irradiance (intensity) is not less than 360 nm and less than 620 nm. The unit of the spectral irradiance (intensity) of light may be, for example, $W \cdot m^{-2} \cdot nm^{-1}$. By adjusting the wavelength of light to be applied to the metal material in the wavelength region of not less than 360 nm and less than 620 nm, it is easy to control the composition of iron oxide and iron hydroxide produced from the metal material and water. Thus, nanocrystals with high crystallinity can be obtained. The crystallinity (degree of crystallization) of nanocrystals can be confirmed, for example, by X-ray diffraction (XRD) analysis. The compositions of iron oxide and iron hydroxide can be confirmed, for example, by point analysis performed by energy dispersive X-ray analysis (EDX). When the wavelength is not less than 620 nm, it is difficult to obtain nanocrystals, and hydrogen gas is hardly produced. When the wavelength is less than 360 nm, nanocrystals tend to be easily decomposed, and the shape of the nanocrystals tends to collapse. The present inventors presume that the reason why nanocrystals tend to be easily decomposed when the wavelength is less than 360 nm is as follows. When the wavelength is less than 360 nm, the nanocrystal acts as a photocatalyst. When the nanocrystals act as a photocatalyst, as will be described later, photolysis of water occurs, and not only hydrogen gas but also oxygen gas is generated. As a result, the formed iron oxide returns to iron hydroxide, and the nanocrystals are decomposed. When photolysis of water occurs, oxygen gas is generated, so that the purity of the obtained hydrogen gas is low. Further, when the wavelength is less than 360 nm, the energy tends to change to heat, so that the energy efficiency tends to decrease, and the metal material is liable to be damaged by heat. From the viewpoint of easily obtaining the above effect by the above wavelength, in the spectrum of light used in the light irradiation step, the wavelength at which the intensity is maximum is preferably 380 to 600 nm, more preferably 400 to 580 nm. From the viewpoint of efficiency of radiolysis of water, restriction of equipment, band gap of iron oxide and iron hydroxide, and prevention of generation of heat energy (heat generation) when relaxing excited electrons, the above wavelength may be appropriately adjusted within the above range.

The light source of the light applied to the metal material is not particularly limited as long as it can apply the light. The light source may be, for example, the sun, an LED, a xenon lamp, a mercury lamp, a fluorescent lamp, or the like. The light applied to the metal material may be, for example, sunlight or simulated sunlight. The sunlight can be suitably used from the viewpoint that it is inexhaustibly applied to the earth and can be used as renewable energy that does not emit greenhouse gases and the like. The simulated sunlight means light which does not use the sun as the light source and whose spectrum matches the spectrum of the sunlight. The simulated sunlight can be emitted, for example, by a solar simulator using a metal halide lamp, a halogen lamp, or a xenon lamp. The simulated sunlight is generally used for the purpose of evaluating the strength of a material against ultraviolet rays, evaluating a solar cell, or evaluating weather resistance. Also in the nanocrystal production method according to the present embodiment, simulated sunlight can be suitably used.

In the light irradiation step, light may be applied to an interface where the surface of the metal material and water are in contact with each other. The interface can be obtained by, for example, a method of immersing a metal material in water, a method of flowing water through a part or the whole of a metal material, or the like. In the light irradiation step, from the viewpoint of recovery of nanocrystals, it is preferable to immerse the metal material under the water surface.

In the light irradiation step, when light is applied to water in which the metal material is immersed, radiolysis of water may occur. Hydrogen radicals (H.), hydroxyl radicals (.OH), and hydrated electrons ($e_{aq}^-$) are generated as the decomposed species. Among them, hydroxide ions are produced as soon as hydroxyl radicals react with hydrated electrons. In the light irradiation step, the production of hydroxide ions is promoted by the reaction of hydroxyl radicals with hydrated electrons, and production of nanocrystals may be promoted. In other words, in the light irradiation step, a photochemical reaction involving production of radicals may occur.

In the nanocrystal production method according to the present embodiment, iron oxide may be previously formed as a natural oxide film on the surface of the metal material. A band gap Eg of iron oxide ($Fe_2O_3$) contained in the natural oxide film is 2.2 eV. Accordingly, by applying light having a wavelength of not more than 563 nm having energy corresponding to the band gap of iron oxide, the natural oxide film absorbs light. As a result, electrons and holes ($h^+$) are excited, electrons become hydrated electrons in the process of radiolysis of water, and the growth of nanocrystals may be promoted. However, absorption of light and production of hydrated electrons in the natural oxide film as described above are not essential for production of nanocrystals.

The nanocrystal production method according to the present embodiment may further include a surface roughening step of roughening the surface of the metal material before the light irradiation step. That is, in the light irradiation step, the roughened surface of the metal material may be irradiated with light. By performing the surface roughening step, irregularities are formed on the surface of the metal material, and the growth rate of nanocrystals tends to be improved. When irregularities are formed on the surface of the metal material, the electron density at the tip of the nanocrystal tends to increase. As a result, it is presumed that a lot of hydrated electrons are produced at the tip of the nanocrystal, and the production of hydroxide ions described above and the subsequent formation of nanocrystals are promoted.

The size of the irregularities formed on the surface of the metal material by the surface roughening step is not particularly limited. From the viewpoint of accelerating the photochemical reaction and promoting the growth of nanocrystals, the average value of the sizes of the bases of the protrusions is preferably not less than 10 nm and not more than 500 nm, and the average value of intervals between adjacent protrusions is preferably not less than 2 nm and not more than 200 nm. The average value of the sizes of the bases of the protrusions is more preferably not less than 15 nm and not more than 300 nm, and the average value of the intervals between the adjacent protrusions is more preferably not less than 5 nm and not more than 150 nm. The average value of the sizes of the bases of the protrusions is further preferably not less than 20 nm and not more than 100 nm, and the average value of the intervals between the adjacent protrusions is further preferably not less than 10 nm and not more than 100 nm. The size of the base of the protrusion means a maximum width of the protrusion in a direction perpendicular to the height direction of the protrusion.

The surface roughening step may be carried out by, for example, machining the surface of the metal material, chemical treatment, or discharge treatment in a liquid. The discharge treatment in a liquid means treatment of discharge in a liquid having conductivity. Examples of the machining include grinding using abrasive paper, buff, or a grinding stone, blasting, and processing using sandpaper or the like. Examples of the chemical treatment include etching with acid or alkali. As the discharge treatment in a liquid, for example, as described in International Publication No. 2008/099618, a voltage is applied to a counter electrode including an anode and a cathode arranged in a liquid having conductivity, and plasma is generated near the cathode to locally melt the cathode. In the discharge treatment in a liquid, irregularities can be formed on the surface of a metal material by using the metal material for the cathode.

The discharge treatment in a liquid may be carried out, for example, by using the following apparatus. The apparatus which carries out the discharge treatment in a liquid includes a cell which contains a liquid having conductivity, a pair of electrodes not in contact with each other and arranged in the cell, and a DC power supply which applies a voltage to the electrode pair. The electrode pair is a cathode and an anode. As the cathode, a metal material is used. The material of the anode is not particularly limited as long as it is stable in a liquid having conductivity in a state of not being energized. The material of the anode may be, for example, platinum or the like. The surface area of the anode may be greater than the surface area of the cathode. The liquid having conductivity may be, for example, a potassium carbonate ($K_2CO_3$) aqueous solution or the like.

The surface of the metal material after the surface roughening step may be exposed to the outside or may be covered with a natural oxide film.

The metal material is not particularly limited as long as it is a material containing iron. The content of iron in the metal material may be 10.0 to 100% by mass, 15.0 to 100% by mass, or 20.0 to 100% by mass, based on the total mass of the metal material. The higher the content of iron in the metal material, the easier iron oxide or iron hydroxide is produced, and the easier the composition of the iron oxide or iron hydroxide is controlled. The metal material may contain, for example, pure iron or an iron alloy and may be formed of only pure iron or only an iron alloy. The metal material may contain an iron compound such as iron sulfide (FeS), iron carbonate ($FeCO_3$), or iron complex. The metal material may include iron scrap. The iron scrap may contain the iron compound. The metal materials may be used singly or in combination of two or more.

The iron alloy is not particularly limited as long as it is an alloy containing iron. The iron content in the iron alloy is preferably 10.0 to 99.8% by mass, more preferably 15.0 to 99.5% by mass, further preferably 20.0 to 99.0% by mass, particularly preferably 25.0 to 99.0% by mass from the viewpoint of nanocrystal productivity.

Examples of the iron alloy include Fe—C based alloy, Fe—Au based alloy, Fe—Al based alloy, Fe—B based alloy, Fe—Ce based alloy, Fe—Cr based alloy, Fe—Cr—Ni based alloy, Fe—Cr—Mo based alloy, Fe—Cr—Al based alloy, Fe—Cr—Cu based alloy, Fe—Cr—Ti based alloy, Fe—Cr—Ni—Mn based alloy, Fe—Cu based alloy, Fe—Ga based alloy, Fe—Ge based alloy, Fe—Mg based alloy, Fe—Mn based alloy, Fe—Mo based alloy, Fe—N based alloy, Fe—Nb based alloy, Fe—Ni based alloy, Fe—P based alloy, Fe—S based alloy, Fe—Si based alloy, Fe—Si—Ag based alloy, Fe—Si—Mg based alloy, Fe—Ti based alloy, Fe—U based alloy, Fe—V based alloy, Fe—W based alloy, and Fe—Zn based alloy.

Among the above iron alloys, Fe—C based alloy, Fe—Cr based alloy, Fe—Cr—Ni based alloy, Fe—Cr—Mo based alloy, Fe—Cr—Al based alloy, Fe—Cr—Ti based alloy, Fe—Cr—Ni—Mn based alloy, Fe—Cu based alloy, Fe—Mg based alloy, Fe—Mn based alloy, Fe—Mo based alloy, Fe—Nb based alloy, Fe—Ni based alloy, Fe—P based alloy, Fe—Si based alloy, Fe—Si—Ag based alloy, Fe—Si—Mg based alloy, Fe—Ti based alloy, and Fe—Zn based alloy are widely used industrially, and these iron alloys can be suitably used like pure iron from the viewpoints of having inherent properties of iron and corrosion resistance in water.

The metal material may further contain other atoms inevitably mixed. Examples of other atoms inevitably mixed include Ag, C, Mn, Sb, Si, K, Na, Li, Ba, Sr, Ca, Mg, Be, Zn, Pb, Cd, Tl, V, Al, Zr, W, Mo, Ti, Co, Ni, and Au. The content of the atoms contained in the metal material may be, for example, not more than 3% by mass based on the total mass of the metal material. The content of the atoms contained in the metal material is preferably not more than 1% by mass from the viewpoint of nanocrystal productivity.

The shape of the metal material is not particularly limited. Examples of the shape of the metal material include a plate shape, a block shape, a ribbon shape, a round wire shape, a sheet shape, a mesh shape, and a combination thereof. The shape of the metal material is preferably a plate shape, a block shape, or a sheet shape from the viewpoints of recoverability of nanocrystals and workability of immersion into water.

A method for producing the metal material is not particularly limited. Examples of the method for producing the metal material include industrially widely used methods such as a reduction method, a blast furnace method, an electric furnace method, and a melt reduction method. The reduction method means a method of removing oxygen from iron oxide contained in iron ore and taking out iron.

Water in which the metal material is immersed may be at least one selected from the group consisting of pure water, ion exchange water, rain water, tap water, river water, well water, filtered water, distilled water, reverse osmosis water, mineral water, spring water, dam water, and sea water. As water, pure water, ion exchange water, and tap water are preferable from the viewpoint of composition control and productivity of nanocrystals. However, as naturally derived water, river water, well water, dam water, sea water and the like can also be suitably used.

The pH of water may be 5.00 to 10.0. By setting the pH to not less than 5.00, the formation of nanocrystals can be promoted while suppressing corrosion of the metal material in water under light irradiation (conventional rust-producing reaction). On the other hand, by setting the pH to not more than 10.0, workability is improved when nanocrystals are recovered from the surface of the metal material. The pH of the water is preferably 5.5 to 9.5, more preferably 6.0 to 9.0, from the viewpoint of composition control of nanocrystals. The pH of water may be 5.5 to 8.2 or 5.5 to 7.5.

The pH of water may be measured by, for example, a pH meter (LAQUAact, portable pH meter, water quality meter) manufactured by HORIBA, Ltd.

The electrical conductivity of water may be not more than 80000 μS/cm. From the viewpoint of enhancing the crystallinity of nanocrystals while suppressing corrosion of the metal material in water (conventional rust-producing reaction), the electrical conductivity of water is preferably not more than 10000 μS/cm, more preferably not more than 5000 μS/cm, further preferably not more than 1.0 μS/cm. The lower limit value of the electrical conductivity of water may be, for example, 0.05 μS/cm.

The electrical conductivity of water may be measured by, for example, a pH meter (LAQUAact, portable pH meter, water quality meter) manufactured by HORIBA, Ltd.

The purity of water is not particularly limited. The purity of water means the ratio of the mass of water molecules contained in water. The purity of water may be, for example, not less than 80.0% by mass based on the total mass of water. When the purity of water is not less than 80.0% by mass, the influence of impurities under light irradiation can be suppressed. The influence of impurities includes, for example, precipitation of salt and formation of a passivation film. The purity of water is preferably not less than 85.0% by mass, more preferably not less than 90.0% by mass, from the viewpoint of composition control of nanocrystals. The upper limit value of the purity of water may be, for example, 100.0% by mass.

The purity of water can be controlled by electrical conductivity in some cases. For example, when the type of solute (impurity) dissolved in water is specified, and when the purity of water is in the above range, the concentration of the solute and the electrical conductivity often have a proportional relationship. On the other hand, in water mixed with a plurality of solutes (impurities), even if the electrical conductivity is measured, it is difficult to ascertain the purity of water from the obtained value. The purity of water is preferably controlled by the electrical conductivity of water.

The concentration of dissolved oxygen in water is not particularly limited. From the viewpoint of promoting the growth reaction of nanocrystals by light irradiation and preventing corrosion of the metal material in water, the concentration of dissolved oxygen in water is preferably not more than 15 mg/L, more preferably not more than 12 mg/L, further preferably not more than 10 mg/L, based on the total volume of water, for example. The lower limit value of the concentration of dissolved oxygen in water may be, for example, 8.0 mg/L.

The concentration of dissolved oxygen in water may be measured by, for example, a pH meter (LAQUAact, portable pH meter, water quality meter) manufactured by HORIBA, Ltd.

The temperature of water is not particularly limited. From the viewpoints of prevention of coagulation and evaporation of water and prevention of corrosion of the metal material, for example, the temperature of water is preferably 0 to 80° C., more preferably 2 to 75° C., further preferably 5 to 70° C.

The nanocrystal contains at least one of iron oxide and iron hydroxide. The nanocrystal may be composed of iron oxide and iron hydroxide and may be composed only of iron oxide or only of iron hydroxide. The iron oxide contained in the nanocrystal may be, for example, FeO, $\alpha$-$Fe_2O_3$, $\gamma$-$Fe_2O_3$, $Fe_3O_4$, $Cr_2FeO_4$, $CoFe_2O_4$, $ZnFe_2O_4$ or the like. The iron hydroxide contained in the nanocrystal may be, for example, $Fe(OH)_3$, FeOOH, $Fe_5HO_8 \cdot 4H_2O$ or the like.

The shape of nanocrystal may be at least one selected from the group consisting of a needle shape, a columnar shape, a rod shape, a tubular shape, a scaly shape, a lump shape, a flower shape, a starfish shape, a branch shape, and a convex shape. The flower shape means a shape in which a plurality of columnar crystals extend radially from the center of the crystal. The starfish shape means a shape in which a plurality of columnar crystals extend at substantially equal intervals in the same plane from the center of the crystal.

The maximum width (for example, length) of nanocrystal may be 2 nm to 10 μm, or 2 nm to 1000 nm. The maximum width of nanocrystal implies the maximum width of an aggregate of a plurality of nanocrystals. The height of nanocrystal from the surface of the metal material is not particularly limited. The nanocrystal may be a solid structure or a hollow structure.

The concentration of hydrogen in produced gas may be measured by a gas chromatography mass spectrometry method. The apparatus used for the measurement may be a general gas chromatograph. As a gas chromatograph, for example, GC-14B manufactured by Shimadzu Corporation may be used. Measurement using the gas chromatograph may be performed by placing argon as a carrier gas and a sample in a syringe.

In the gas chromatography mass spectrometry method, it is preferable to correct the concentration of hydrogen gas in consideration of mixing of air. When nitrogen (N) was not contained in the metal material and water, and when nitrogen gas ($N_2$) was contained in analyzed gas, it is considered that air was mixed in a syringe in the measurement performed by the gas chromatography mass spectrometry method. The volume of the produced hydrogen gas can be obtained by subtracting the total of the volume of nitrogen gas and the volume of components (for example, oxygen gas) of the mixed air excluding nitrogen gas from the total volume of the analyzed gas.

For example, as a result of gas chromatograph measurement, it is assumed that the types of gases contained in the analyzed gas and the volume ratio were hydrogen gas ($H_2$):oxygen gas ($O_2$):nitrogen gas ($N_2$)=A:B:C. When nitrogen is not contained in the metal material and water, it can be considered that the produced gases are only hydrogen gas and oxygen gas. At this time, it is assumed that the analyzed value of air measured using the gas chromatograph was oxygen gas ($O_2$):nitrogen gas ($N_2$)=b:c. The ratio of the gas minus the air content is hydrogen gas ($H_2$):oxygen gas ($O_2$)=A:{B−(C×b÷c)}. The concentration of the produced hydrogen gas can be calculated using this ratio.

As shown in FIG. 1, the water 2 and the metal material 4 may be contained in a container 6a. The container 6a may include a container body 8a, which contains the water 2 and the metal material 4, and a lid body 10a. The container 6a may not include the lid body 10a. From the viewpoint of capturing hydrogen gas, the container 6a preferably includes the lid body 10a. The lid body 10a may hermetically close the container body 8a. The light L may be applied using a lamp (light source) 12. By virtue of the use of the lamp 12, it is possible to irradiate the surface of the metal material with light of a certain intensity. The position of the lamp 12 may be appropriately adjusted so that nanocrystals are effectively formed. When sunlight is applied, the lamp 12 may not be used. When sunlight is applied, the position and orientation of the container 6a may be appropriately adjusted so that sunlight is applied onto the surface of the metal material 4.

Figure 2:
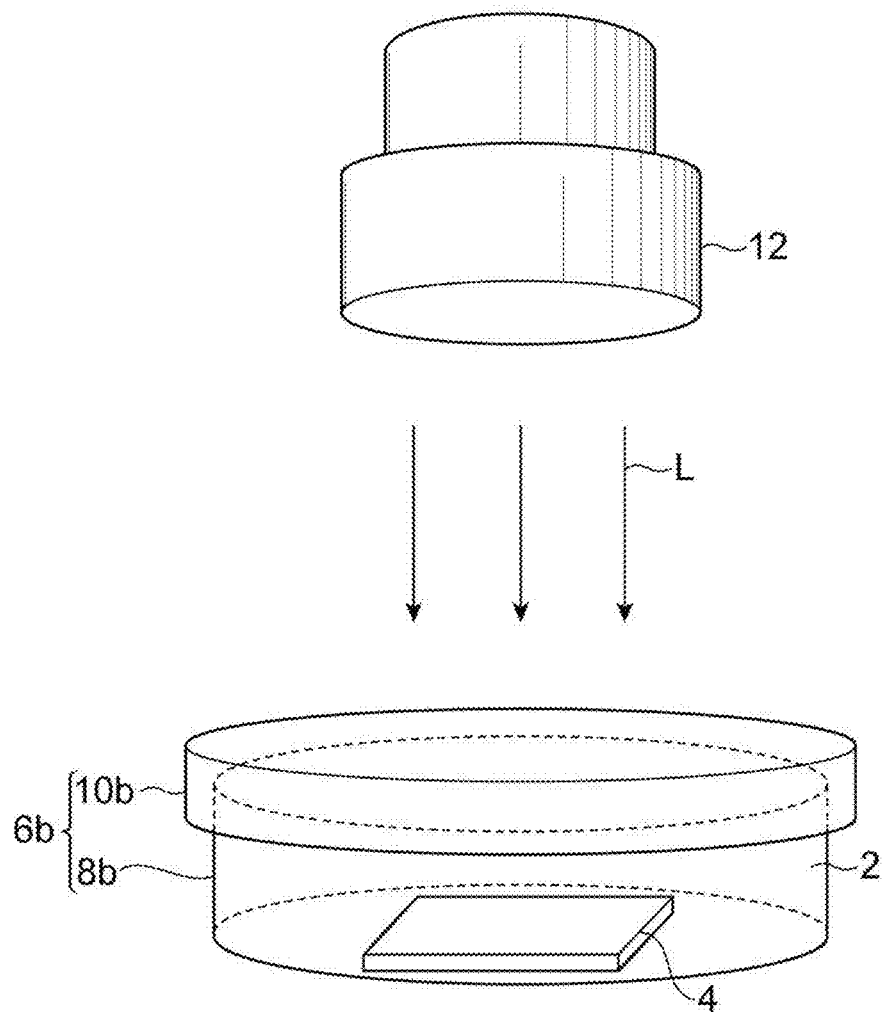
FIG. 2 is a schematic diagram showing the nanocrystal production method according to the embodiment of the present invention.

As shown in FIG. 1, the surface of the metal material 4 irradiated with light may be vertically erected, or as shown in FIG. 2, the surface irradiated with light may be horizontal.

A distance from a water surface to the light irradiation surface of the metal material 4 can be appropriately set according to the type of the metal material and water, and is not particularly limited. The distance may be, for example, 5 mm to 10 m. From the viewpoint of suppressing reduction in the effect due to light scattering and recovery of nanocrystals, the distance is preferably 5 mm to 8 m, more preferably from 5 mm to 5 m.

The shape of the container body 8a is not particularly limited. The shape of the container body 8a may be a rectangular parallelepiped shape like the container body 8a shown in FIG. 1 or may be a columnar shape like a container body 8b provided in a container 6b shown in FIG. 2. The shape of the container body 8a may be appropriately selected so that the surface of the metal material 4 can be effectively irradiated with light.

The shape of the lid body 10a is not particularly limited. The shape of the lid body 10a may be a rectangular parallelepiped shape like the lid body 10a shown in FIG. 1 or may be a columnar shape like a lid body 10b shown in FIG. 2. The shape of the lid body 10a may be appropriately selected so that the surface of the metal material 4 can be effectively irradiated with light.

The material of the container 6a (the container body 8a and the lid body 10a) is not particularly limited as long as it does not interrupt the irradiation of the surface of the metal material with light. It is preferable that the material of the container body 8a and the lid body 10a does not react with water. The material of the container body 8a and the lid body 10a may be glass, plastic, or the like, for example.

From the viewpoint of capturing hydrogen gas additionally produced, the material of the container body 8a and the lid body 10a is preferably glass.

The steel production method according to the present embodiment includes a step of forming nanocrystals on the surface of a metal material by the nanocrystal production method according to the present embodiment, a step of removing the nanocrystals from the surface of the metal material to recover the nanocrystals, and a step of producing steel using the metal material from which the nanocrystals have been removed. In the step of forming the nanocrystals on the surface of the metal material, a gas containing hydrogen may be produced while forming the nanocrystals. The gas containing hydrogen may consist only of hydrogen.

In a general recycling method of waste materials such as iron scrap, steel materials have been produced by electrolytic refining (such as an electric furnace method). On the other hand, in the present embodiment, for example, not only steel materials can be reproduced from iron scrap, but also nanocrystals and hydrogen gas can be produced. In the production process of nanocrystals, in terms of being able to utilize sunlight (natural energy), the steel production method according to the present embodiment can be said to be an environmentally conscious steelmaking process.

The steel production method according to the present embodiment may further include at least one of a separation step of separating hydrogen gas produced in the light irradiation step, a purification step, and a recovery step. In the steel production method according to the present embodiment, since the purity of the produced hydrogen gas is high, the separation step and the purification step may be omitted.

(Hydrogen Production Mechanism)

In the present embodiment, the reaction mechanism in which hydrogen is produced along with nanocrystals has not necessarily been elucidated. The present inventors believe that one of the mechanisms of hydrogen production reaction is a photocatalytic reaction in which the nanocrystals themselves function as photocatalysts. However, the present inventors believe that in the present embodiment, the photocatalytic reaction with nanocrystals is not a dominant reaction, and as described above, the reaction in which water and hydrogen are produced along with production of iron oxyhydroxide (FeOOH) and iron oxide ($Fe_2O_3$) is a dominant reaction. Hereinafter, the photocatalytic reaction in which the reaction mechanism is comparatively known will be described.

In the present embodiment, the reaction of producing hydrogen gas together with nanocrystals is different from the photolysis reaction of water using a photocatalyst such as titanium dioxide ($TiO_2$). The reaction of producing hydrogen gas in the photocatalytic reaction with titanium dioxide is as follows. The band gap Eg of titanium dioxide is 3.2 eV. Accordingly, as titanium dioxide immersed in water is irradiated with light with a wavelength of not more than 380 nm having energy corresponding to the band gap of titanium dioxide, titanium dioxide absorbs light. As a result, electrons and holes are excited. The holes oxidize water to produce oxygen gas as shown in the following reaction formula (7). The electrons reduce hydrogen ions ($H^+$) to produce hydrogen gas as shown in the following reaction formula (8). In the photocatalytic reaction, not only hydrogen gas but also oxygen gas is produced by photolysis of water.

$$H_2O + 2h^+ \rightarrow 0.5 O_2 + 2H^+ \qquad (7)$$

$$2e^- + 2H^+ \rightarrow H_2 \qquad (8)$$

In the above photocatalytic reaction with titanium dioxide, when a hydrogen evolution potential is taken as a reference (zero), an energy level of the conduction band of titanium dioxide is negative, and hydrogen gas and oxygen gas are generated at a molar ratio (stoichiometric ratio) of 2:1. In contrast, in the photocatalytic reaction with nanocrystals, the energy level of the conduction band of the nanocrystal is positive, and the molar ratio of hydrogen and oxygen in generated gas does not necessarily satisfy the stoichiometric ratio. The present inventors presume that the mechanism of reaction by which hydrogen gas is produced in the photocatalytic reaction with nanocrystals is as follows.

As the nanocrystal is irradiated with light having energy corresponding to the band gap of iron oxide or iron hydroxide, iron oxide or iron hydroxide absorbs light. For example, when the iron oxide is iron oxide ($Fe_2O_3$), the band gap Eg is 2.2 eV, and the wavelength of light having energy corresponding to this band gap is not more than 563 nm. When iron oxide or iron hydroxide absorbs light, electrons and holes are excited. The holes oxidize water to produce oxygen gas as shown in the above reaction formula (7). The electrons reduce hydrogen ions to produce hydrogen gas as shown in the above reaction formula (8).

Here, in the photocatalytic reaction, in order to cause the reaction in which hydrogen ions are reduced by electrons to generate hydrogen gas, it is necessary to satisfy the condition that the band gap of a photocatalyst is large, and when the hydrogen evolution potential is taken as a reference (zero), the energy level of the conduction band of the photocatalyst is negative. Although titanium dioxide satisfies this condition, the energy level of the conduction band of titanium dioxide is close to the hydrogen evolution potential. Titanium dioxide also has low catalytic activity for hydrogen evolution. Thus, in order to actually use titanium dioxide as a photocatalyst for water decomposition, a platinum (Pt) electrode is provided as a counter electrode of titanium dioxide, and a negative bias voltage (for example, about −0.5 V) should be applied to the titanium dioxide side in some cases.

On the other hand, for example, since the band gap of nanocrystals formed from iron oxide ($Fe_2O_3$) is narrower than the band gap of titanium dioxide, the photocatalytic reaction with nanocrystals progresses by using light having a wavelength longer that in the case of titanium dioxide. However, the energy level of the conduction band of iron oxide is positive relative to the hydrogen evolution potential. In general, when the energy level of the conduction band of the photocatalyst is positive, it is considered that hydrogen is not produced without a bias voltage. However, the present inventors presume that in the photocatalytic reaction with nanocrystals, hydrogen is produced by a chemical bias even without a bias voltage as described below. As described above, nanocrystal growth occurs through the reaction between hydroxide ions, generated by radiolysis of water or reaction between water and holes, and $Fe^{3+}$. Thus, particularly at the tip of the nanocrystal, the pH of water locally shifts to the alkaline side. As a result, this becomes a chemical bias, charge separation between electrons and holes progresses efficiently, hydrogen ions are reduced by electrons, and the reaction for generating hydrogen gas is promoted.

In the above photocatalytic reaction with nanocrystals, hydrogen gas can be produced by photolysis of water while forming nanocrystals using visible light without requiring application of a bias voltage. Since it is unnecessary to use two types of electrodes including a positive electrode and a negative electrode and hydrogen gas can be produced by using visible light, the photocatalytic reaction with nanocrystals is industrially superior to the photocatalytic reaction with titanium dioxide.

In general photolysis of water, oxygen gas is also produced in addition to hydrogen gas; however, most of the gas produced in the photocatalytic reaction with nanocrystals may be hydrogen gas. In other words, the concentration of hydrogen in the produced gas may be greater than the concentration of hydrogen stoichiometrically calculated from the molecular formula of water ($H_2O$). That is, the concentration of hydrogen in the produced gas may be greater than 66.7% by volume, based on the total volume of the gas. The concentration of hydrogen in the produced gas may be greater than 66.7% by mole, based on the total number of moles of all components contained in the gas. The present inventors presume that the mechanism by which highly pure hydrogen gas can be obtained in the photocatalytic reaction with nanocrystals is as follows. In the photocatalytic reaction with nanocrystals, as described above, oxygen gas is generated by the reaction between water and holes; however, even when oxygen gas is generated, oxygen gas and iron ions ($Fe^{2+}$ or $Fe^{3+}$) ionized in water react directly. As a result, the growth of iron oxide is promoted, the concentration of oxygen in gas decreases, and the concentration of hydrogen increases. Since solubility of oxygen gas in water is larger than that of hydrogen gas, the concentration of hydrogen gas in the generated gas becomes high.

EXAMPLES

Hereinafter, the present invention is further illustrated in more detail by way of Examples and Comparative Examples; however, the present invention is not limited thereto.

Example 1

In Example 1, a metal material was prepared by the following method, and the surface roughening step and the light irradiation step were performed.

(Metal Material)

Iron having a purity of 99.5% by mass was rolled to form a plate-like metal material. The metal material had a dimension of 50 mm×10 mm and a thickness of 0.5 mm.

(Surface Roughening Step)

Subsequently, the surface of the metal material was subjected to discharge treatment in a liquid by the following method. In a glass container, 300 mL of a potassium carbonate aqueous solution having a potassium carbonate ($K_2CO_3$) concentration of 0.1 mol/L was contained. In the potassium carbonate aqueous solution, a cathode and an anode were arranged at a depth of 100 mm or less from the liquid level. A distance between the cathode and the anode was 50 mm. As the cathode, the above metal material was used. As the anode, a net-like platinum electrode was used. The platinum electrode had a dimension of 40 mm×550 mm. The platinum electrode had a line width of 0.5 mm. The length of a platinum wire within an electrode area of the platinum electrode was 600 mm. Then, the discharge treatment in a liquid was performed at a cell voltage of 120 V for a discharge time of 10 minutes.

The surface of the metal material after the surface roughening step was observed with a scanning electron microscope. As the scanning electron microscope, JSM-7001F manufactured by JEOL Ltd. was used. As a result, many irregularities were formed on the surface of the metal material. The size of the base of the protrusion was 5 nm on average.

(Light Irradiation Step)

Subsequently, the light irradiation step was performed by the following method. Pure water was placed in a glass container, and the metal material after the surface roughening step was immersed in the pure water. The pH and electrical conductivity of pure water were measured with a pH meter. As the pH meter, LAQUAact (portable pH meter, water quality meter) manufactured by HORIBA, Ltd. was used. The pH of pure water was 7.0, and the electrical conductivity of the pure water was not more than 1.0 μS/cm. The above container was closed with a plastic lid to be hermetically closed.

As shown in FIG. 1, a metal material, a container, and a light source were arranged, and the surface of the metal material was irradiated with light. That is, light was applied to the surface of the metal material from a direction perpendicular to the surface of the metal material. As the light source, a xenon lamp was used. As the xenon lamp, a spot light source (Lightning Cure LC8) manufactured by Hamamatsu Photonics K.K. was used. A dedicated optical filter was attached to the xenon lamp, and the wavelength range of light was set to 400 to 600 nm. The surface of the metal material was irradiated with light for 48 hours. The light output was 280 W. The spectroscopic spectrum of light was measured with a spectroradiometer. As the spectroradiometer, SOLO 2 manufactured by Gentec-EO Inc. was used. As a result, in the spectrum of light emitted from the xenon lamp, the wavelength at which the intensity was maximum was not less than 360 nm and less than 620 nm. In the spectrum of the light emitted from the xenon lamp, the wavelength at which the intensity was maximum was about 493 nm. The intensity of the light at a light irradiation position 5 cm away from the light source was 3025 $Wm^{-2}$. The light irradiation position may be referred to as the position of the surface of the metal material.

Example 2

In Example 2, the same metal material as in Example 1 was prepared. Subsequently, in the same manner as in Example 1, the surface roughening step was performed. Subsequently, the light irradiation step was performed in the same manner as in Example 1 except for the following points. In the light irradiation step of Example 2, the light irradiation time was 72 hours.

Example 3

In Example 3, the same metal material as in Example 2 was prepared. Subsequently, in the same manner as in Example 2, the surface roughening step was performed. Subsequently, the light irradiation step was performed in the same manner as in Example 2 except for the following points.

In the light irradiation step of Example 3, the surface of the metal material was irradiated with simulated sunlight without using a xenon lamp as a light source. A solar simulator (HAL-320) manufactured by Asahi Spectra Co., Ltd. was used as a light source of simulated sunlight. The solar simulator uses a xenon lamp. The wavelength range of the simulated sunlight emitted by the solar simulator is 350 to 1100 nm. As shown in FIG. 2, the metal material, a container, and the light source were arranged. That is, light was applied to the surface of the metal material from a direction perpendicular to the surface of the metal material. The light output was 300 W. The spectroscopic spectrum of the light was measured with the above spectroradiometer. As a result, in the spectrum of simulated sunlight, the wavelength at which the intensity was maximum was not less than 360 nm and less than 620 nm. In the spectrum of simulated sunlight, the wavelength at which the intensity was maximum was about 460 nm. The intensity of the light at the light irradiation position 60 cm away from the light source was 1000 $W/m^2$.

Example 4

In Example 4, the same metal material as in Example 2 was prepared. Subsequently, in the same manner as in Example 2, the surface roughening step was performed. Subsequently, the light irradiation step was performed in the same manner as in Example 2 except for the following points.

In the light irradiation step of Example 4, the surface of the metal material was irradiated with sunlight without using a xenon lamp as a light source. The wavelength range of sunlight is approximately 300 to 3000 nm. Irradiation with sunlight was performed in an area of 43 degrees north in the fine weather condition of June between 9 am and 3 pm until an integrated time of light irradiation reached 72 hours. The spectroscopic spectrum of the light was measured with the above spectroradiometer. As a result, in the spectrum of sunlight, the wavelength at which the intensity was maximum was not less than 360 nm and less than 620 nm. In the spectrum of sunlight, the wavelength at which the intensity was maximum was about 520 nm. The intensity of the light at the light irradiation position was 750 W/m² on average.

Example 5

In Example 5, the same metal material as in Example 3 was prepared. Subsequently, in the same manner as in Example 3, the surface roughening step was performed. Subsequently, the light irradiation step was performed in the same manner as in Example 3 except for the following points.

In the light irradiation step of Example 5, river water was used instead of pure water. The pH and electrical conductivity of river water were measured with the pH meter described above. As a result, the pH of the river water was 7.5, and the electrical conductivity of the river water was 350 µS/cm.

Example 6

In Example 6, the same metal material as in Example 3 was prepared. Subsequently, in the same manner as in Example 3, the surface roughening step was performed. Subsequently, the light irradiation step was performed in the same manner as in Example 3 except for the following points.

In the light irradiation step of Example 6, sea water was used instead of pure water. The pH and electrical conductivity of sea water were measured with the pH meter described above. As a result, the pH of the sea water was 8.2, and the electrical conductivity of the sea water was 55000 µS/cm.

Example 7

In Example 7, a metal material was prepared in the same manner as in Example 3. Next, the following surface roughening step was performed. Subsequently, in the same manner as in Example 3, the light irradiation step was performed.

(Surface Roughening Step)

The surface of the metal material was polished with abrasive paper by the following method. First, the surface of the metal material immersed in water was polished with #400 waterproof abrasive paper, and then the surface of the metal material was polished with #800 waterproof abrasive paper. As the waterproof abrasive paper, abrasive paper manufactured by Fujimoto-kagaku Corporation was used.

The surface of the metal material after the surface roughening step was observed with the above scanning electron microscope. As a result, many irregularities were formed on the surface. An interval between adjacent protrusions was 13 µm on average.

Example 8

In Example 8, the following metal material was prepared. Subsequently, in the same manner as in Example 3, the surface roughening step and the light irradiation step were performed.

(Metal Material)

Fe—Cr—Ni based alloy was rolled to form a plate-like metal material. The metal material had a dimension of 50 mm×10 mm and a thickness of 0.5 mm. The Fe—Cr—Ni based alloy was austenitic stainless steel containing 70.3% by mass of Fe, 18.2% by mass of Cr, and 11.5% by mass of Ni.

Example 9

In Example 9, the following metal material was prepared. Subsequently, in the same manner as in Example 3, the surface roughening step and the light irradiation step were performed.

(Metal Material)

Fe—C based alloy was rolled to form a plate-like metal material. The metal material had a dimension of 50 mm×10 mm and a thickness of 0.5 mm. The Fe—C based alloy was cast iron containing 96.5% by mass of Fe and 3.5% by mass of C.

Example 10

In Example 10, the following metal material was prepared. Subsequently, in the same manner as in Example 3, the surface roughening step and the light irradiation step were performed.

(Metal Material)

Iron scrap generated when cutting tools were manufactured was used as the metal material. The shape of the iron scrap was a plate-like shape. The iron scrap had a dimension of 50 mm×250 mm and a thickness of 10 mm. The iron scrap contained 77.8% by mass of Fe, 17.8% by mass of W, 4.2% by mass of Cr, and 0.2% by mass of C. Iron scrap was classified as chromium tungsten steel scrap according to Japan Industrial Standard (JIS) iron scrap classification criteria G2401 and G4404. There were no scratches on the surface of the iron scrap, and there were no marks of welding and paint marks.

Example 11

In Example 11, a metal material was prepared in the same manner as in Example 1. Next, the following surface roughening step was performed. Subsequently, in the same manner as in Example 1, the light irradiation step was performed.

(Surface Roughening Step)

The surface of the metal material was polished so as to become a mirror surface by the following method. First, the surface of the metal material was polished with #2000 waterproof abrasive paper. As the waterproof abrasive paper, waterproof abrasive paper manufactured by Fujimoto-kagaku was used. Subsequently, the surface of the metal material was polished using a tabletop polishing machine, a polishing buff, and a diamond abrasive. The grain size of the diamond abrasive was 0.25 μm. As the tabletop polishing machine, "RPO-128K Refine Polisher, 200 HV" manufactured by Refine Tec Ltd. was used. Both the polishing buff and the diamond abrasive were manufactured by Refine Tec Ltd. The surface of the metal material after the surface roughening step was observed with the above scanning electron microscope. As a result, clear irregularities were not formed on the surface of the metal material after the surface roughening step of Example 11.

Example 12

In Example 12, a metal material was prepared in the same manner as in Example 3. Subsequently, in the same manner as in Example 3, the surface roughening step was performed. Subsequently, the light irradiation step was performed in the same manner as in Example 3 except for the following points.

In the light irradiation step of Example 12, pure water added with a dilute hydrochloric acid aqueous solution was used instead of pure water. The pH and electrical conductivity of pure water were measured with the pH meter described above. As a result, the pH of pure water was 5.5, and the electrical conductivity of the pure water was not more than 1.0 μS/cm.

Example 13

In Example 13, the same metal material as in Example 8 was prepared. Subsequently, in the same manner as in Example 4, the surface roughening step was performed. Subsequently, the light irradiation step was performed in the same manner as in Example 4 except for the following points.

In the light irradiation step of Example 4, river water was used instead of pure water. The pH and electrical conductivity of river water were measured with the pH meter described above. As a result, the pH of the river water was 7.5. The electrical conductivity of the river water was 350 μS/cm.

Example 14

In Example 14, the same metal material as in Example 1 was prepared. Subsequently, the light irradiation step was performed in the same manner as in Example 1, without performing the surface roughening step.

Example 15

In Example 15, the same metal material as in Example 4 was prepared. Subsequently, in the same manner as in Example 7, the surface roughening step was performed. Subsequently, in the same manner as in Example 4, the light irradiation step was performed.

Example 16

In Example 16, the same metal material as in Example 2 was prepared. Subsequently, in the same manner as in Example 2, the surface roughening step was performed. Subsequently, the light irradiation step was performed in the same manner as in Example 2 except for the following points.

In the light irradiation step of Example 16, a dedicated optical filter was attached to the xenon lamp used in Example 2, and the wavelength range of light was set to 500 to 800 nm. The surface of the metal material was irradiated with light for 72 hours. The light output was 280 W. The spectroscopic spectrum of the light was measured with the above spectroradiometer. As a result, in the spectrum of light emitted from the xenon lamp, the wavelength at which the intensity was maximum was not less than 360 nm and less than 620 nm. In the spectrum of the light emitted from the xenon lamp, the wavelength at which the intensity was maximum was about 600 nm. The intensity of the light at the light irradiation position 60 cm away from the light source was 1000 W/m$^2$.

Example 17

In Example 17, the same metal material as in Example 2 was prepared. Subsequently, in the same manner as in Example 2, the surface roughening step was performed. Subsequently, the light irradiation step was performed in the same manner as in Example 2 except for the following points.

In the light irradiation step of Example 17, a UV lamp was used without using a xenon lamp as a light source. As the UV lamp, B-100AP manufactured by UVP, Inc. was used. The surface of the metal material was irradiated with light for 72 hours. The light output was 100 W. The spectroscopic spectrum of the light was measured with the above spectroradiometer. As a result, in the spectrum of light emitted from the UV lamp, the wavelength at which the intensity was maximum was not less than 360 nm and less than 620 nm. In the spectrum of the light emitted from the UV lamp, the wavelength at which the intensity was maximum was about 365 nm. The intensity of the light at the light irradiation position 20 cm away from the light source was 100 W/m$^2$.

Comparative Example 1

In Comparative Example 1, the same metal material as in Example 1 was prepared. Subsequently, in the same manner as in Example 1, the surface roughening step was performed. Then, pure water was placed in a glass container, and the metal material after the surface roughening step was immersed in the pure water. The pH and electrical conductivity of pure water were measured with the pH meter described above. As a result, the pH of pure water was 7.0, and the electrical conductivity of the pure water was not more than 1.0 μS/cm. The above container was closed with a plastic lid to be hermetically closed and was held for 72 hours. In Comparative Example 1, the light irradiation step was not performed.

Comparative Example 2

In Comparative Example 2, the same metal material as in Example 1 was prepared. Subsequently, in the same manner as in Example 1, the surface roughening step was performed. Subsequently, the light irradiation step was performed in the same manner as in Example 1 except for the following points.

In the light irradiation step of Comparative Example 2, an infrared lamp was used instead of a xenon lamp. As the infrared lamp, a SICCA 250 W 240 V infrared lamp manufactured by Osram GmbH was used. The wavelength of light of the infrared lamp is greater than 1000 nm. The spectroscopic spectrum of the light was measured with the above spectroradiometer. As a result, in the optical spectrum of the infrared lamp, the wavelength at which the intensity was maximum was not less than 620 nm. In the optical spectrum of the infrared lamp, the wavelength at which the intensity was maximum was about 1100 nm. The intensity of the light at the light irradiation position was 35 W/m² on average.

Comparative Example 3

In Comparative Example 3, the same metal material as in Example 3 was prepared. Subsequently, in the same manner as in Example 3, the surface roughening step was performed. Subsequently, the light irradiation step was performed in the same manner as in Example 3 except for the following points.

In the light irradiation step of Comparative Example 3, acetone was used instead of pure water. As acetone, acetone (purity: 99.5% by mass) manufactured by Wako Pure Chemical Industries, Ltd. was used.

Comparative Example 4

In Comparative Example 4, the same metal material as in Example 2 was prepared. Subsequently, in the same manner as in Example 2, the surface roughening step was performed. Subsequently, the light irradiation step was performed in the same manner as in Example 2 except for the following points.

In the light irradiation step of Comparative Example 4, a dedicated optical filter was attached to the xenon lamp used in Example 2, and the wavelength range of light was set to 600 to 1000 nm. The surface of the metal material was irradiated with light for 72 hours. The light output was 280 W. The spectroscopic spectrum of the light was measured with the above spectroradiometer. As a result, in the spectrum of light emitted from the xenon lamp, the wavelength at which the intensity was maximum was not less than 620 nm. In the spectrum of the light emitted from the xenon lamp, the wavelength at which the intensity was maximum was about 820 nm. The intensity of the light at the light irradiation position 60 cm away from the light source was 1000 W/m².

Table 1 shows the metal materials of Examples 1 to 17 and Comparative Examples 1 to 4, the surface roughening step, water, and conditions of the light irradiation step.

[Table 1]

TABLE 1

| | Metal material | | Surface roughening step | | Water | | | Light irradiation condition | | |
|---|---|---|---|---|---|---|---|---|---|---|
| | Composition | Iron content (mass %) | Method | Condition | Type | pH | Electrical conductivity (µS/cm) | Light source | Wavelength range (nm) | Irradiation time (h) |
| Example 1 | Fe | 99.5 | In-liquid discharge | $K_2CO_3$aq, 120 V, 10 min | Pure water | 7.0 | <1.0 | Xe lamp | 400 to 600 | 48 |
| Example 2 | Fe | 99.5 | In-liquid discharge | $K_2CO_3$aq, 120 V, 10 min | Pure water | 7.0 | <1.0 | Xe lamp | 400 to 600 | 72 |
| Example 3 | Fe | 99.5 | In-liquid discharge | $K_2CO_3$aq, 120 V, 10 min | Pure water | 7.0 | <1.0 | Simulated sunlight (Xe) | 350 to 1100 | 72 |
| Example 4 | Fe | 99.5 | In-liquid discharge | $K_2CO_3$aq, 120 V, 10 min | Pure water | 7.0 | <1.0 | Sunlight | 300 to 3000 | 72 (Integration) |
| Example 5 | Fe | 99.5 | In-liquid discharge | $K_2CO_3$aq, 120 V, 10 min | River water | 7.5 | 350 | Simulated sunlight (Xe) | 350 to 1100 | 72 |
| Example 6 | Fe | 99.5 | In-liquid discharge | $K_2CO_3$aq, 120 V, 10 min | Sea water | 8.2 | 55000 | Simulated sunlight (Xe) | 350 to 1100 | 72 |
| Example 7 | Fe | 99.5 | Use abrasive paper | #400, #800 | Pure water | 7.0 | <1.0 | Simulated sunlight (Xe) | 350 to 1100 | 72 |
| Example 8 | Fe—Cr—Ni | 70.3 | In-liquid discharge | $K_2CO_3$aq, 120 V, 10 min | Pure water | 7.0 | <1.0 | Simulated sunlight (Xe) | 350 to 1100 | 72 |
| Example 9 | Fe—C | 96.5 | In-liquid discharge | $K_2CO_3$aq, 120 V, 10 min | Pure water | 7.0 | <1.0 | Simulated sunlight (Xe) | 350 to 1100 | 72 |
| Example 10 | Fe scrap | 77.8 | In-liquid discharge | $K_2CO_3$aq, 120 V, 10 min | Pure water | 7.0 | <1.0 | Simulated sunlight (Xe) | 350 to 1100 | 72 |
| Example 11 | Fe | 99.5 | Buff polishing | Diamond abrasive (0.25 µm) | Pure water | 7.0 | <1.0 | Xe lamp | 400 to 600 | 48 |
| Example 12 | Fe | 99.5 | In-liquid discharge | $K_2CO_3$aq, 120 V, 10 min | Pure water | 5.5 | <1.0 | Simulated sunlight (Xe) | 350 to 1100 | 72 |
| Example 13 | Fe—Cr—Ni | 70.3 | In-liquid discharge | $K_2CO_3$aq, 120 V, 10 min | River water | 7.5 | 350 | Sunlight | 300 to 3000 | 72 (Integration) |
| Example 14 | Fe | 99.5 | Nothing | — | Pure water | 7.0 | <1.0 | Xe lamp | 400 to 600 | 48 |
| Example 15 | Fe | 99.5 | Use abrasive paper | #400, #800 | Pure water | 7.0 | <1.0 | Sunlight | 300 to 3000 | 72 (Integration) |
| Example 16 | Fe | 99.5 | In-liquid discharge | $K_2CO_3$aq, 120 V, 10 min | Pure water | 7.0 | <1.0 | Xe lamp | 500 to 800 | 72 |
| Example 17 | Fe | 99.5 | In-liquid discharge | $K_2CO_3$aq, 120 V, 10 min | Pure water | 7.0 | <1.0 | UV lamp | 365 | 72 |
| Comparative Example 1 | Fe | 99.5 | In-liquid discharge | $K_2CO_3$aq, 120 V, 10 min | Pure water | 7.0 | <1.0 | No light irradiation | | 48 |
| Comparative Example 2 | Fe | 99.5 | In-liquid discharge | $K_2CO_3$aq, 120 V, 10 min | Pure water | 7.0 | <1.0 | Infrared lamp | >1000 | 48 |
| Comparative Example 3 | Fe | 99.5 | In-liquid discharge | $K_2CO_3$aq, 120 V, 10 min | Acetone | — | — | Simulated sunlight (Xe) | 350 to 1100 | 72 |
| Comparative Example 4 | Fe | 99.5 | In-liquid discharge | $K_2CO_3$aq, 120 V, 10 min | Pure water | 7.0 | <1.0 | Xe lamp | 600 to 1000 | 72 |

<Evaluation>

(Crystal Phase)

The surface of the metal material after the light irradiation step of each of Examples 1 to 17 and Comparative Examples 1 to 4 was individually analyzed by an X-ray diffraction (XRD) method to identify the main crystal phase formed on the surface of the metal material. In the XRD analysis, the surface of the metal material was irradiated with Cu—Ka ray using an X-ray diffractometer. The measurement conditions for the XRD analysis were as follows. As the X-ray diffractometer, ATG-G (powder X-ray diffraction) manufactured by Rigaku Corporation was used. The main crystal phases detected are shown in Tables 2 and 3.

Output: 50 kV-300 mA
Scan speed: 4.0°/min
Measurement mode: 0-20
Diffraction angle: 10 to 60°

(Presence/Absence, Shape, and Composition Analysis of Nanocrystals)

The surface of the metal material after the light irradiation step of each of Examples 1 to 17 and Comparative Examples 1 to 4 was individually observed with the above scanning electron microscope to check presence or absence of nanocrystals. When nanocrystals were formed, the shape of the nanocrystals was evaluated. In addition, an element analysis of microstructures such as nanocrystals or coating films and the like formed on the surface of a metal member was performed by point analysis performed by energy dispersive X-ray analysis (EDX) attached to the above scanning electron microscope.

Figure 3:
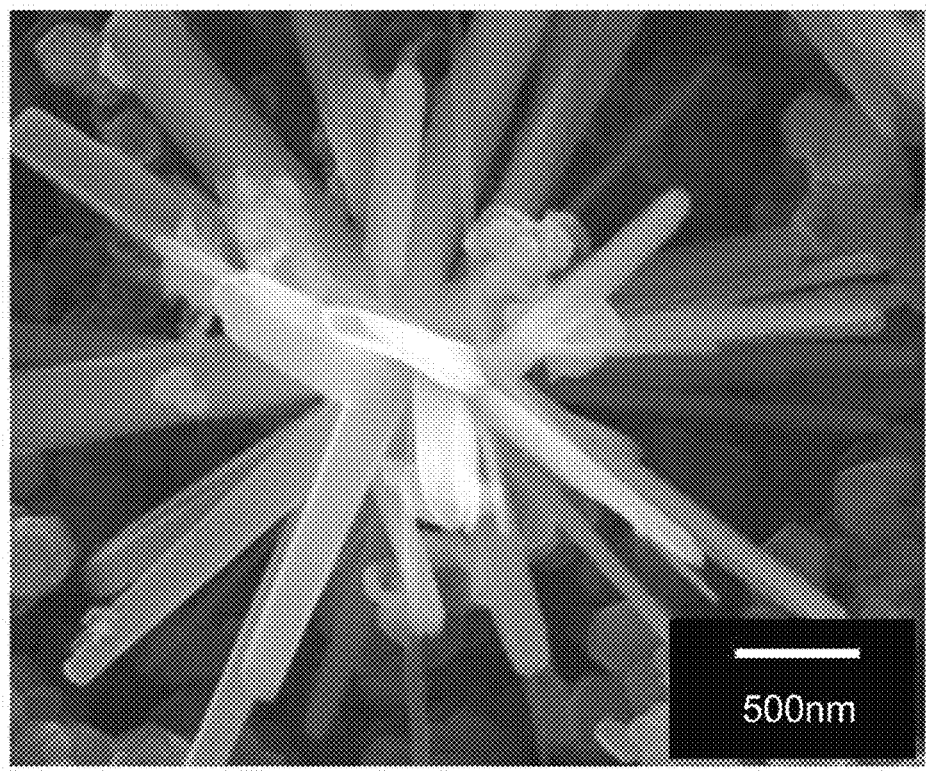
FIG. 3 is an image showing an example of a flower-like nanocrystal photographed by a scanning electron microscope (SEM).
Figure 4:
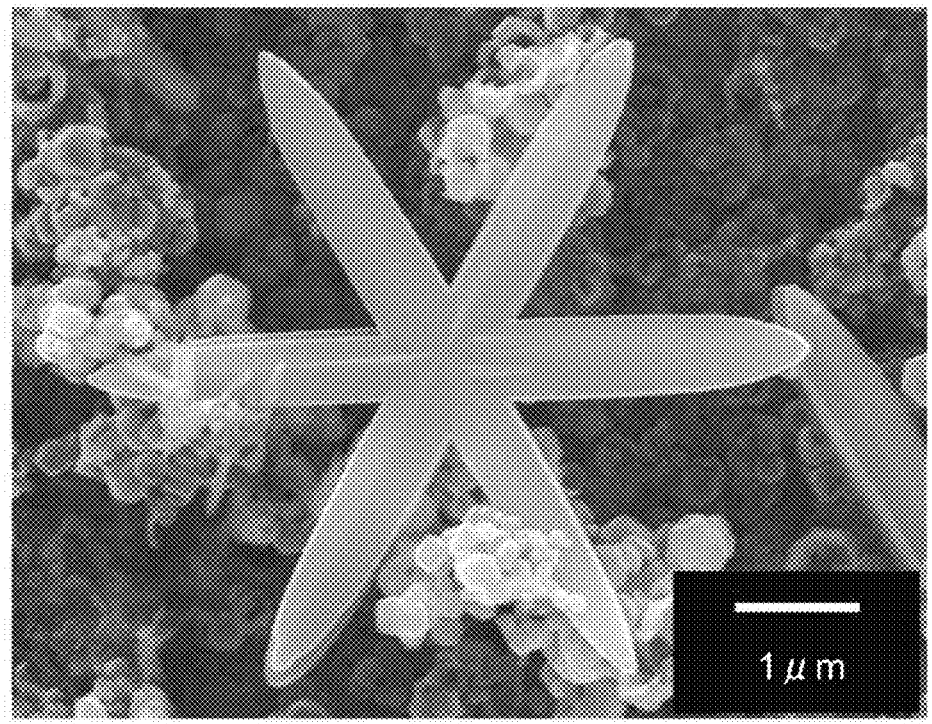
FIG. 4 is an image showing an example of a starfish-like nanocrystal photographed by a scanning electron microscope (SEM).

Many nanocrystals having a flower shape as shown in FIG. 3 and a starfish shape as shown in FIG. 4 were observed on the surfaces of the metal materials of Examples 1 to 17. As the shape of nanocrystals of each of Examples 1 to 17, the flower shape and the starfish shape were predominant No nanocrystals were formed on the surfaces of the metal materials of Comparative Examples 1 to 3. In Comparative Examples 1 to 3, iron oxide or iron hydroxide shown in Table 3 uniformly covered the surface of the metal material. Almost no nanocrystals were confirmed on the surface of the metal material of Comparative Example 4. The EDX analysis of microstructures formed on the surface of the metal material showed that a coating film composed of at least one of iron oxide and iron hydroxide shown in Table 3 was formed on the surface of the metal material of Comparative Example 4.

(Analysis of Gas)

In the light irradiation step of each of Examples 1 to 17 and Comparative Examples 1 to 4, whether or not gas was produced inside the container was visually confirmed individually. That is, it was visually confirmed individually whether or not bubbles were accumulated in an upper portion of the container after the light irradiation step of each of Examples 1 to 17 and Comparative Examples 1 to 4. When gas was produced inside the container, the volume of the produced gas was visually measured. In addition, the types and concentrations of components contained in the produced gas were measured by gas chromatography mass spectrometry (GC-MS) method. In the gas chromatography mass spectrometry, measurement was performed using gas chromatograph such that argon as a carrier gas and a sample were placed in a syringe. As the gas chromatograph, GC-14B manufactured by Shimadzu Corporation was used. As the volume of the produced gas, the value (unit: cc/cm$^2$) per light irradiation area on the surface of the metal material was calculated. When nitrogen is not contained in the metal material and water before use, and when nitrogen gas is contained in the analyzed gas, the concentration of produced hydrogen gas was corrected by the above-described method such that the volumes of nitrogen and oxygen derived from air were excluded from the total volume of the produced gas.

In Examples 1 to 17 and Comparative Example 4, it was visually confirmed that gas was accumulated in the container after the light irradiation step. The volumes of the produced gases of Examples 1 to 17 and Comparative Example 4 are shown in Tables 2 and 3. On the other hand, in Comparative Examples 1 to 3, no gas was produced. As a result of the gas chromatography mass spectrometry, hydrogen gas ($H_2$), nitrogen gas ($N_2$), and oxygen gas ($O_2$) were detected from the gases of Examples 1 to 17 and Comparative Example 4. It was found that hydrogen gas ($H_2$) was dominant in each of the gases of Examples 1 to 17 and Comparative Example 4. However, the volume of the produced gas of Comparative Example 4 was smaller than the volumes of the produced gases of Examples 1 to 17.

Figure 5:
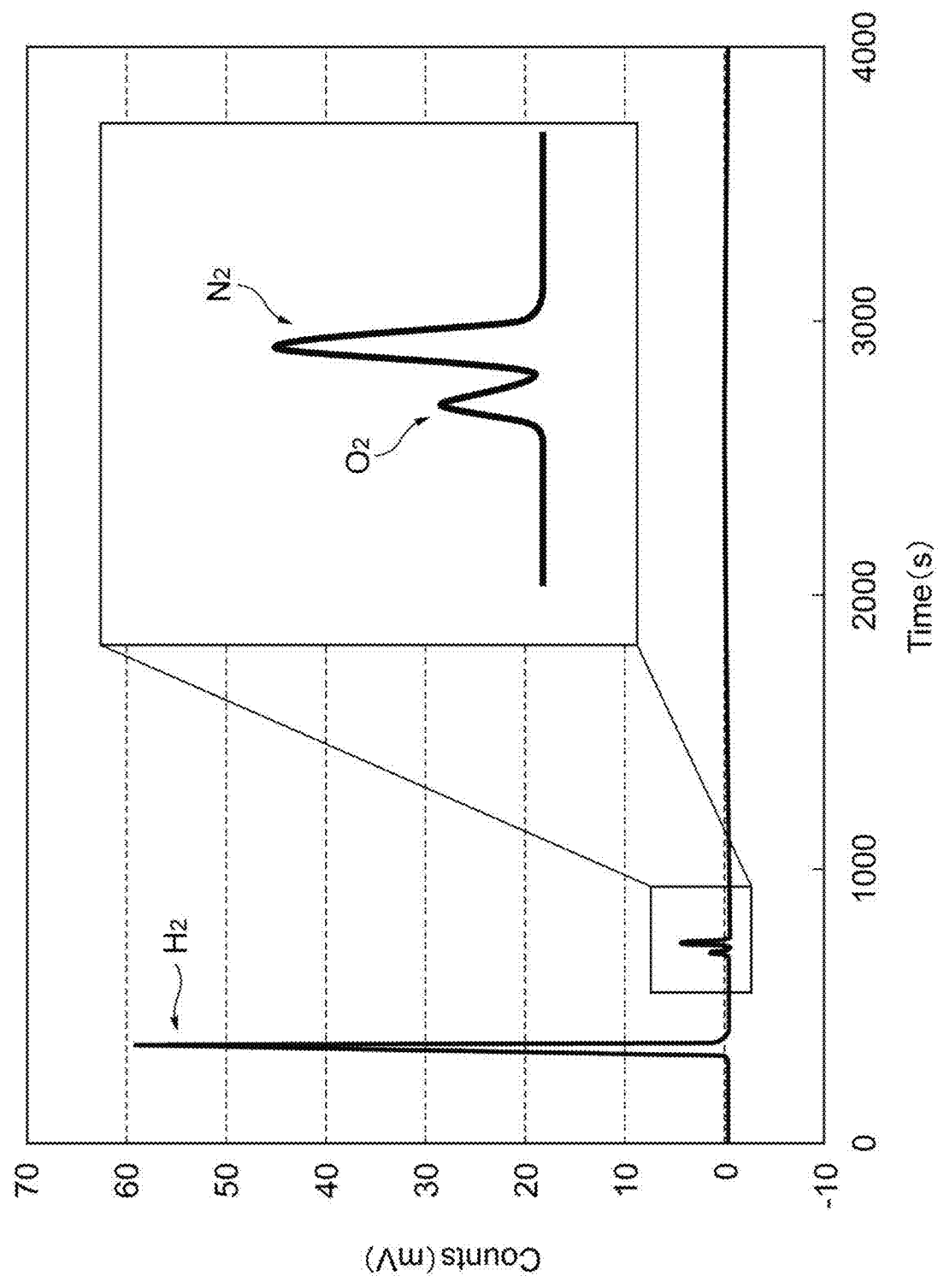
FIG. 5 is a chromatogram of a gas produced in a light irradiation step in Example 2.

FIG. 5 is a chromatogram of the gas produced in the light irradiation step in Example 2. In the produced gas of Example 2, hydrogen gas ($H_2$):oxygen gas ($O_2$):nitrogen gas ($N_2$) was 52:1:3 in volume ratio. In Example 2, nitrogen was not contained in the metal material and water before use. Accordingly, nitrogen gas detected by the gas chromatography mass spectrometry is considered to be due to contamination of air during the analysis. When only air was analyzed by the gas chromatography mass spectrometry, oxygen gas:nitrogen gas was 2:7 in volume ratio in air. Based on this result, the concentration (unit: vol %) of hydrogen gas after correction was calculated by the above-described method. The concentration of hydrogen gas in Example 2 was 99.7% by volume. Also in Examples 1 and 3 to 17 and Comparative Example 4, the concentration of hydrogen gas after correction was calculated in the same manner as in Example 2. The concentrations of hydrogen gasses of Examples 1 to 17 and Comparative Example 4 are shown in Tables 2 and 3.

TABLE 2

| | Gas analysis | | |
|---|---|---|---|
| | Gas volume (cc/cm$^2$) | Hydrogen concentration (vol %) | XRD analysis result Main crystal phase |
| Example 1 | 2.5 | 99.0 | FeO, α-Fe$_2$O$_3$, γ-Fe$_2$O$_3$, Fe$_3$O$_4$ |
| Example 2 | 3.0 | 99.7 | FeO, α-Fe$_2$O$_3$, γ-Fe$_2$O$_3$, Fe$_3$O$_4$ |
| Example 3 | 2.8 | 98.2 | FeO, α-Fe$_2$O$_3$, γ-Fe$_2$O$_3$, Fe$_3$O$_4$, Fe(OH)$_3$ |
| Example 4 | 2.3 | 97.5 | FeO, α-Fe$_2$O$_3$, γ-Fe$_2$O$_3$, Fe$_3$O$_4$, Fe(OH)$_3$ |
| Example 5 | 1.8 | 98.5 | FeO, α-Fe$_2$O$_3$, γ-Fe$_2$O$_3$, Fe$_3$O$_4$, Fe(OH)$_3$ |
| Example 6 | 1.4 | 98.0 | FeO, α-Fe$_2$O$_3$, γ-Fe$_2$O$_3$, Fe$_3$O$_4$, Fe(OH)$_3$ |
| Example 7 | 1.4 | 99.3 | FeO, α-Fe$_2$O$_3$, γ-Fe$_2$O$_3$, Fe$_3$O$_4$ |
| Example 8 | 2.0 | 96.9 | FeO, α-Fe$_2$O$_3$, γ-Fe$_2$O$_3$, Fe$_3$O$_4$ |
| Example 9 | 1.9 | 97.2 | FeO, α-Fe$_2$O$_3$, γ-Fe$_2$O$_3$, Fe$_3$O$_4$, Cr$_2$FeO$_4$ |

TABLE 3

| | Gas analysis | | |
|---|---|---|---|
| | Gas volume (cc/cm$^2$) | Hydrogen concentration (vol %) | XRD analysis result Main crystal phase |
| Example 10 | 1.6 | 96.4 | FeO, α-Fe$_2$O$_3$, γ-Fe$_2$O$_3$, Fe$_3$O$_4$ |
| Example 11 | 1.2 | 99.0 | FeO, α-Fe$_2$O$_3$, γ-Fe$_2$O$_3$, Fe$_3$O$_4$ |
| Example 12 | 2.4 | 98.3 | FeO, α-Fe$_2$O$_3$, γ-Fe$_2$O$_3$, Fe$_3$O$_4$ |
| Example 13 | 1.6 | 98.1 | FeO, α-Fe$_2$O$_3$, γ-Fe$_2$O$_3$, Fe$_3$O$_4$ |
| Example 14 | 1.5 | 98.9 | FeO, α-Fe$_2$O$_3$, γ-Fe$_2$O$_3$, Fe$_3$O$_4$ |
| Example 15 | 1.5 | 98.8 | FeO, α-Fe$_2$O$_3$, γ-Fe$_2$O$_3$, Fe$_3$O$_4$ |
| Example 16 | 1.5 | 98.9 | FeO, α-Fe$_2$O$_3$, γ-Fe$_2$O$_3$, Fe$_3$O$_4$ |
| Example 17 | 1.5 | 97.9 | FeO, α-Fe$_2$O$_3$, γ-Fe$_2$O$_3$, Fe$_3$O$_4$ |
| Comparative Example 1 | — | — | Fe(OH)$_3$ |
| Comparative Example 2 | — | — | Fe(OH)$_3$, FeOOH, Fe$_2$O$_3$ |
| Comparative Example 3 | — | — | α-Fe$_2$O$_3$, γ-Fe$_2$O$_3$ |
| Comparative Example 4 | 0.9 | 98.0 | Fe(OH)$_3$, FeOOH, Fe$_2$O$_3$ |

As shown in Tables 2 and 3, it was confirmed that in Examples 1 to 17, nanocrystals containing at least one of iron oxide and iron hydroxide could be easily formed on the surface of the metal material. Based on the result of the XRD analysis and the fact that the surface of the metal material exhibited brown or black color, it is considered that the crystal phase of Fe$_2$O$_3$ or Fe$_3$O$_4$ was predominantly formed on the surface of the metal material of each of Examples 1 to 17.

As shown in Tables 2 and 3, in Examples 1 to 17, it was found that the volume of the produced gas per light irradiation area exceeded 1 cc/cm$^2$ and high-concentration hydrogen gas was produced. Further, as shown in Tables 2 and 3, there was a tendency that a difference in the volume of the produced gas was generated depending on the iron content of the metal material and the pH or electrical conductivity of water. Here, it was found that the volume of the gas produced in Example 3 was larger than the volume of the gas produced in Example 7. Examples 3 and 7 differ only in the method in the surface roughening step with respect to the surface of the metal material. The present inventors believe that the reason that the volume of the produced gas of Example 3 is larger than the volume of the produced gas of Example 7 is as follows. The irregularities on the surface of the metal material formed by the discharge treatment in a liquid of Example 3 are finer than the irregularities on the surface of the metal material formed by polishing of Example 7. Thus, the electron density at the tip of the nanocrystal of Example 3 increases, and a lot of hydrated electrons are produced at the tip of the nanocrystal. As a result, the production of hydroxide ions, the formation of nanocrystals subsequent thereto, and the production of hydrogen gas are further promoted.

Further, it was found that the volume of the gas produced in Example 1 was larger than the volume of the gas produced in Example 11. Examples 1 and 11 differ only in the method in the surface roughening step with respect to the surface of the metal material. The present inventors believe that the reason that the volume of the produced gas of Example 1 is larger than the volume of the produced gas of Example 11 is as follows. The irregularities on the surface of the metal material formed by the discharge treatment in a liquid of Example 1 are finer than the irregularities on the surface of the metal material formed by polishing of Example 11. Thus, the electron density at the tip of the nanocrystal of Example 1 increases, and a lot of hydrated electrons are produced at the tip of the nanocrystal. As a result, the production of hydroxide ions, the formation of nanocrystals subsequent thereto, and the production of hydrogen gas are further promoted.

In Comparative Example 1, Fe(OH)$_3$ was detected on the surface of the metal material by XRD analysis. However, in Comparative Example 1, Fe(OH)$_3$ was uniformly distributed on the surface of the metal material. Further, in Comparative Example 1, no gas was produced in the light irradiation step. From the above, it is considered that the surface of the metal material after the light irradiation step of Comparative Example 1 was iron rusted in water.

In Comparative Example 2, it is considered that since the irradiated light was infrared light, the reaction for generating nanocrystals did not progress. In Comparative Example 2, it can be also considered that since the irradiated light was infrared light, a natural oxide film (for example, Fe$_2$O$_3$) originally present in the metal material did not absorb light and the above-described photochemical reaction did not progress.

In Comparative Example 3, it is considered that since the metal material was immersed in acetone instead of water, no hydroxide ions were present, and no nanocrystals were formed. With acetone, radiolysis of water does not occur even when light is applied, and there is no dissociated hydroxide ion.

In Comparative Example 4, almost no nanocrystals were confirmed. In Comparative Example 4, it is considered that since the wavelength at which the intensity was maximum was not less than 620 nm in the spectrum of the irradiated light, production and growth of nanocrystals hardly occurred. In other words, in Comparative Example 4, it is considered that the reaction in which nanocrystals containing at least one of iron oxyhydroxide (FeOOH) and iron oxide (Fe$_2$O$_3$) are generated from iron hydroxide (Fe(OH)$_3$) produced according to the above reaction formula (4) hardly progressed, and the photoinduced tip growth of nanocrystals subsequent thereto hardly occurred. The volume of the produced gas of Comparative Example 4 was smaller than the volumes of the produced gasses of Examples 1 to 17. In Comparative Example 4, it is considered that since the production and growth of nanocrystals hardly occurred, its accompanying production of water molecules and hydrogen gas also hardly occurred.

REFERENCE SIGNS LIST

2 water
4 metal material
6a, 6b container
8a, 8b container body
10a, 10b lid
12 lamp (light source)
L light

The invention claimed is:

1. A nanocrystal production method comprising
   a light irradiation step of applying light to a surface of a metal material immersed in water to form nanocrystals on the surface of the metal material,
   wherein the metal material contains iron,
   the nanocrystals contain at least one of iron oxide and iron hydroxide, and
   in a spectrum of the light, a wavelength at which an intensity is maximum is not less than 360 nm and less than 620 nm.

2. The nanocrystal production method according to claim 1, further comprising a surface roughening step of roughening the surface of the metal material before the light irradiation step.

3. The nanocrystal production method according to claim 2, wherein the surface roughening step is performed by machining, chemical treatment, or discharge treatment in a liquid.

4. The nanocrystal production method according to claim 1, wherein the metal material comprises pure iron or an iron alloy.

5. The nanocrystal production method according to claim 1, wherein a content of the iron in the metal material is 10.0 to 100% by mass based on a total mass of the metal material.

6. The nanocrystal production method according to claim 1, wherein the light is sunlight or simulated sunlight.

7. The nanocrystal production method according to claim 1, wherein the water is at least one selected from the group consisting of pure water, ion exchange water, rain water, tap water, river water, well water, filtered water, distilled water, reverse osmosis water, mineral water, spring water, dam water, and sea water.

8. The nanocrystal production method according to claim 1, wherein pH of the water is 5.00 to 10.0.

9. The nanocrystal production method according to claim 1, wherein electrical conductivity of the water is 0.05 to 1.0 µS/cm.

10. The nanocrystal production method according to claim 1, wherein a shape of the nanocrystals is at least one selected from the group consisting of a needle shape, a columnar shape, a rod shape, a tubular shape, a scaly shape, a lump shape, a flower shape, a starfish shape, a branch shape, and a convex shape.

11. The nanocrystal production method according to claim 1, wherein a gas containing hydrogen is produced in the light irradiation step.

12. The nanocrystal production method according to claim 11, wherein the number of moles of oxygen in the gas is not less than 0 times and less than 1/2 times the number of moles of the hydrogen.

13. The nanocrystal production method according to claim 1, wherein the metal material comprises iron scrap.

14. A steel production method comprising:
   a step of forming nanocrystals on the surface of the metal material by the nanocrystal production method according to claim 1;
   a step of removing the nanocrystals from the surface of the metal material to recover the nanocrystals; and
   a step of producing steel using the metal material from which the nanocrystals have been removed.

* * * * *